United States Patent [19]

Sakuma et al.

[11] Patent Number: 5,313,426

[45] Date of Patent: May 17, 1994

[54] SEMICONDUCTOR MEMORY DEVICE

[75] Inventors: Shinzo Sakuma; Sampei Miyamoto, both of Tokyo, Japan

[73] Assignee: Oki Electric Industry Co., Ltd., Tokyo, Japan

[21] Appl. No.: 986,998

[22] Filed: Dec. 7, 1992

[30] Foreign Application Priority Data

Dec. 9, 1991 [JP] Japan .................... 3-324811

[51] Int. Cl.$^5$ .................... G11C 11/40; G11C 5/06
[52] U.S. Cl. .................... 365/205; 365/51; 365/207; 365/208
[58] Field of Search .................... 365/205, 207, 208, 51, 365/63; 307/530

[56] References Cited

U.S. PATENT DOCUMENTS

| 4,984,206 | 1/1991 | Komatsu | 365/208 |
| 5,029,330 | 7/1991 | Kajigaya | 365/201 |
| 5,058,058 | 10/1991 | Yasuda | 365/51 |
| 5,216,634 | 6/1993 | Takano | 365/205 |

Primary Examiner—Eugene R. LaRoche
Assistant Examiner—Son Mai
Attorney, Agent, or Firm—Edward D. Manzo

[57] ABSTRACT

A memory device according to the invention has a first pair of bit lines, having first and second bit lines, being coupled to a first memory cell which cause a first potential difference between the first and second bit lines; a second pair of bit lines, having third and fourth bit lines, coupled to a second memory cell which causes a second potential difference between the third and fourth bit lines; a first sense amplifier having first and second transistors each of which is a first conductivity type, the gate electrode of said first transistor being connected to said first bit line, the first electrode of the first transistor being connected to the second bit line, the gate electrode of the second transistor being connected to the second bit line, the first electrode of the second transistor being connected to the first bit line; a second sense amplifier having third and fourth transistors each of which is the first conductivity type, the gate electrode of the third transistor being connected to the third bit line, the first electrode of the third transistor being connected to the fourth bit line, the gate electrode of the fourth transistor being connected to the fourth bit line, the first electrode of the fourth transistor being connected to the third bit line; and the second electrodes of said first, second, third and fourth transistors constituting a first common diffusion region formed in a first area of the major surface.

10 Claims, 6 Drawing Sheets

- ■ METAL-DIFFUSION CONTACT
- ⊠ POLY-DIFFUSION CONTACT
- ◨ POLY-POLY CONTACT

SEMICONDUCTOR MEMORY DEVICE

BACKGROUND OF THE INVENTION

1. Field of the Invention

The present invention relates to a semiconductor memory device, such as Dynamic Random Access Memory (DRAM), particularly to a pattern layout of sense amplifiers and sense amplifier driving circuits employed in such semiconductor memory device.

2. Description of the Related Art

A pattern layout of sense amplifiers and sense amplifier driving circuits employed in a semiconductor memory device, for example, is disclosed in the co-owned pending patent application of Ser. No. 07/705,341, filed on May 24th, 1991, of which the entire disclosure is incorporated herein by reference.

There is, in FIG. 4 of the above mentioned application (not shown in this specification), disclosed a partial pattern layout of a first sense amplifier including negative channel type MOS (NMOS) transistors 232-1a and 232-1b; a second sense amplifier including positive channel type MOS (PMOS) transistors 233-1a and 233-1b; a first sense amplifier driving circuit including a Vss metal line 245a and a NMOS transistor 238a which provide Ground level voltage (Vss) to a Vss node 232-1c of the first sense amplifier; and a second sense amplifier driving circuit including a Vcc metal line 247a and a NMOS transistor 238c which provide supply level voltage (Vcc, such as 5 volts) to a Vcc node 233-1c of the second sense amplifier.

The Vss node 232-1c consists of three metal-diffusion contacts 417, made of aluminum, which electrically connect a first common node metal line 235 with a common source electrode of the NMOS transistors 232-1a and 232-1b in a negative type diffusion region 415. The Vcc node 233-1c also consists of three metal-diffusion contacts 433, made of aluminum, which electrically connect a second common node metal line 237 with a common source electrode of the PMOS transistors 233-1a and 233-1b in a positive type diffusion region 417.

In order to increase the density of LSI or the capacity of a semiconductor memory device, it is required to reduce the size of not only the region forming memory cells but also the region forming the sense amplifier. It is, however, not easy to reduce the diameter (i.e. the dimension of the horizontal cross section) of the metal-diffusion contact formed in each region forming a sense amplifier since the metal-diffusion contact is relatively deep. As the consequence, it is necessary to reduce the number of the metal-diffusion contacts formed in each region forming a sense amplifier, for example, a single contact per sense amplifier.

However, the above solution, the reduction of the number of the metal-diffusion contacts, would reduce the yield rate of the semiconductor memory device since the unevenness in the contact resistance of the contact, caused by manufacturing process, more seriously affects a sense amplifier so as to prevent the sense amplifier from cooperating with another sense amplifier, coupled to the same bit line pair. If worst comes to worst, the sense amplifier could not work due to the flaw (disconnection) of the reduced number of the metal-diffusion contacts formed therein.

SUMMARY OF THE INVENTION

Accordingly, it is an object of the present invention to provide a semiconductor memory device employing an improved layout of sense amplifiers.

It is also an object of the present invention to provide a semiconductor memory device employing an improved layout of sense amplifier driving circuit, accompanied with the improved layout of the sense amplifiers.

It is another object of the present invention to provide a semiconductor memory device employing an improved layout of the sense amplifier which contributes to the reduction of the dimension thereof without the reduction of the yield rate of the semiconductor memory device.

It is still another object of the invention to provide a semiconductor memory device employing an improved layout of the sense amplifiers and the sense amplifier driving circuits having a reduced number of the metal-diffusion contacts without the reduction of the yield rate of the semiconductor memory device.

A semiconductor memory device according to the present invention is provided wherein the semiconductor memory device has a semiconductor substrate having a major surface thereof; a first pair of bit lines, formed over the major surface, has first and second bit lines, the first pair of bit lines being coupled to a first memory cell, the first memory cell causing a first potential difference between the first and second bit lines; a second pair of bit lines, formed over the major surface, has third and fourth bit lines, the second pair of bit lines being coupled to a second memory cell, the second memory cell causing a second potential difference between the third and fourth bit lines; a first sense amplifier has first and second transistors each having first, second and gate electrodes, the first and second transistors each being of a first conductivity type, the gate electrode of said first transistor being connected to said first bit line, the first electrode of the first transistor being connected to the second bit line, the gate electrode of the second transistor being connected to the second bit line, the first electrode of the second transistor being connected to the first bit line; a second sense amplifier has third and fourth transistors each having first, second and gate electrodes, the third and fourth transistors each being of the first conductivity type, the gate electrode of the third transistor being connected to the third bit line, the first electrode of the third transistor being connected to the fourth bit line, the gate electrode of the fourth transistor being connected to the fourth bit line, the first electrode of the fourth transistor being connected to the third bit line; and the second electrodes of said first, second, third and fourth transistors constitute a first common diffusion region formed in a first area of the major surface.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Figure 1:
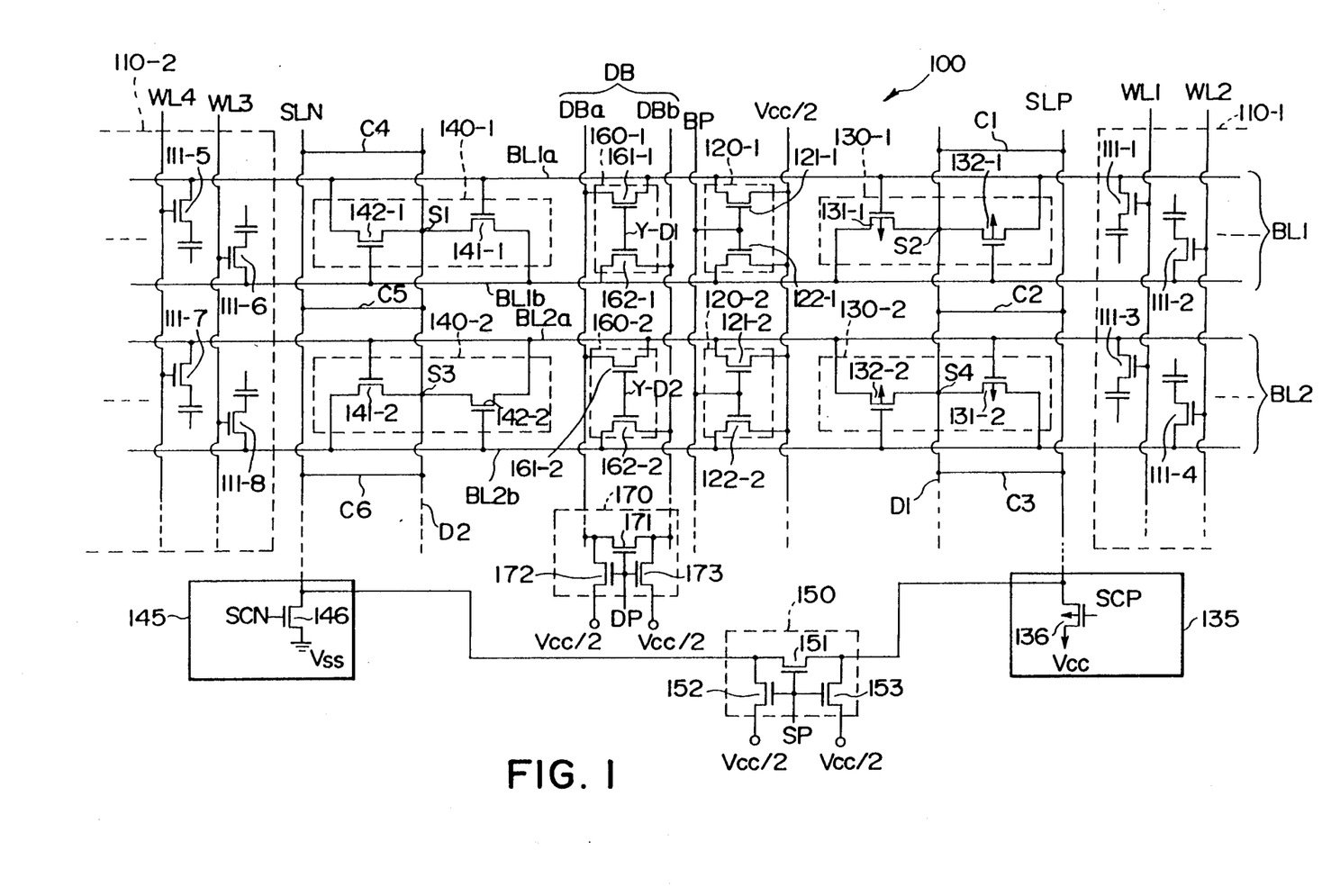
FIG. 1 is a partial circuit diagram of the first embodiment of the semiconductor device according to the invention.

A semiconductor memory device 100 incorporating the present invention is shown in FIG. 1. The semiconductor memory device 100 employs a conventional first memory cell array 110-1 including memory cells 111-1, 111-2, 111-3 and 111-4 therein each having a NMOS transistor and a capacitor to store data therein; a conventional second memory cell array 110-2 including memory cells 111-5, 111-6, 111-7 and 111-8 therein each having a NMOS transistor and a capacitor to store data therein; a conventional first bit line pair BL1, comprised of bit lines BL1a and BL1b, coupled to the memory cells 111-1, 111-2, 111-5 and 111-6; and a second bit line pair BL2, comprised of bit lines BL2a and BL2b, coupled to the memory cells 111-3, 111-4, 111-7 and 111-8. The memory cells 111-1–111-8 are respectively coupled to one of word lines WL1, WL2, WL3 and WL4 such that one of the word lines WL1–WL4 is connected to the gate electrode of the NMOS transistor in the corresponding memory cell.

The bit line pairs BL1 and BL2 are respectively coupled to conventional bit line precharge circuits 120-1 and 120-2. The precharge circuit 120-1 provides a one-half supply voltage (Vcc/2, wherein Vcc is around 3.3 volts in 64 mega-bit DRAM) to both the bit lines BL1a and BL1b of the first bit line pair BL1 through respective NMOS transistors 121-1 and 122-1 upon bit line precharge signal BP being in a high logic level. The precharge circuit 120-2 also provides a one half supply voltage (Vcc/2) to both the bit lines BL2a and BL2b of the second bit line pair BL2 through respective NMOS transistors 121-2 and 122-2 upon bit line precharge signal BP being in high logic level.

The bit line pairs BL1 and BL2 are further coupled to a data bus pair DB comprised of data bus lines DBa and DBb through conventional transfer circuits 160-1 and 160-2. The transfer circuit 160-1 has NMOS transistors 161-1 and 162-1, of which gate electrodes commonly receive a selection signal Y-D1 generated from a conventional decoder circuit (not shown) which provides respective transfer circuits 160-1 and 160-2 with selection signals Y-D1 and Y-D2. The NMOS transistor 161-1 and 162-1 connects the bit lines BL1a and BL1b with the data bus lines DBa and DBb upon the selection signal Y-D1 being in high logic level. The transfer circuit 160-2 has NMOS transistors 161-2 and 162-2, of which gate electrodes commonly receive the selection signal Y-D2. The NMOS transistor 161-2 and 162-2 connects the bit lines BL2a and BL2b with the data bus lines DBa and DBb upon the selection signal Y-D2 being in high logic level. The conventional decoder circuit (not shown) sets one of the selection signals Y-D1 and Y-D2 in the high logic level and the remain in the low logic level so as to select one of the bit line pairs BL1 and BL2 to be connected to the data bus pair DBa and DBb.

The data bus pair DB is further connected to a conventional data bus precharge circuit 170, including three NMOS transistors 171, 172 and 173, which equalizes the data bus lines DBa and DBb in potential by means of the NMOS transistor 171 and simultaneously provides a half of the supply voltage (Vcc/2) to both of the data bus lines DBa and DBb by means of the NMOS transistors 172 and 173 upon a data bus precharge signal DP in the high logic level being supplied to the gate electrodes of the NMOS transistors 171, 172 and 173.

The first bit line pair BL1 is further coupled to a first sense amplifier 140-1 and a second sense amplifier 130-1. The first sense amplifier 140-1 includes NMOS transistors 141-1 and 142-1 each having first and second electrodes and a gate electrode. The first electrode of the NMOS transistor 142-1 is connected to the bit line BL1a; the gate electrode of the NMOS transistor 142-1 is connected to the bit line BL1b; the second electrode of the NMOS transistor 142-1 is connected to the second electrode of the NMOS transistor 141-1 through a node S1; the gate electrode of the NMOS transistor 141-1 is connected to the bit line BL1a; the first electrode of the NMOS transistor 141-1 is connected to the bit line BL1b. While the second sense amplifier 130-1 includes PMOS transistors 131-1 and 132-1 each having first and second electrodes and a gate electrode. The first electrode of the PMOS transistor 132-1 is connected to the bit line BL1a; the gate electrode of the PMOS transistor 132-1 is connected to the bit line BL1b; the second electrode of the PMOS transistor 132-1 is connected to the second electrode of the PMOS transistor 131-1 through a node S2; the gate electrode of the PMOS transistor 131-1 is connected to the bit line BL1a; the first electrode of the PMOS transistor 131-1 is connected to the bit line BL1b.

Similarly to the first bit line pair BL1, the second bit line pair BL2 is coupled to a third sense amplifier 140-2 and a fourth sense amplifier 130-2. The third sense amplifier 140-2 includes NMOS transistors 141-2 and 142-2 each having first and second electrodes and a gate electrode. The first electrode of the NMOS transistor 142-2 is connected to the bit line BL2a; the gate electrode of the NMOS transistor 142-2 is connected to the bit line BL2b; the second electrode of the NMOS transistor 142-2 is connected to the second electrode of the NMOS transistor 141-2 through a node S3; the gate electrode of the NMOS transistor 141-2 is connected to the bit line BL2a; the first electrode of the NMOS transistor 141-2 is connected to the bit line BL2b. While the fourth sense amplifier 130-2 includes PMOS transistors 131-2 and 132-2 each having first and second electrodes and a gate electrode. The first electrode of the PMOS transistor 132-2 is connected to the bit line BL2a; the gate electrode of the PMOS transistor 132-2 is connected to the bit line BL2b; the second electrode of the PMOS transistor 132-2 is connected to the second electrode of the PMOS transistor 131-2 through a node S4; the gate electrode of the PMOS transistor 131-2 is connected to the bit line BL2a; the first electrode of the PMOS transistor 131-2 is connected to the bit line BL1b.

The nodes S1 and S3 of the first and third sense amplifiers 140-1 and 140-2 are commonly connected to a first common diffusion line D2 which is connected to a first sense line SLN made of aluminum through metal-diffusion contacts C4, C5 and C6 made of aluminum. The first sense line SLN is connected to a driver circuit 145 which provides the Ground level potential Vss to the first and third sense amplifiers 140-1 and 140-2 through the first sense line SLN and the contacts C4, C5 and C6 when a NMOS transistor 146 receives a sense amplifier control signal SCN in the high logic level at the gate electrode thereof. While the nodes S2 and S4 of the second and fourth sense amplifiers 130-1 and 130-2 are commonly connected to a second common diffusion line D1 which is connected to a second sense line SLP made of aluminum through metal-diffusion contacts C1, C2 and C3 made of aluminum. The second sense line SLP is connected to a driver circuit 135 which provides the supply voltage Vcc to the second and fourth sense amplifiers 130-1 and 130-2 through the second sense line SLP and the contacts C1, C2 and C3 when a PMOS transistor 136 receives a sense amplifier control signal SCP in the low logic level at the gate electrode thereof.

The first and second sense lines SLN and SLP are further connected to a conventional sense line precharge circuit 150, including three NMOS transistors 151, 152 and 153, which equalizes the first and second sense lines SLN and SLP in potential by means of the NMOS transistor 151 and simultaneously provides a half of the supply voltage (Vcc/2) to both of the first and second sense lines SLN and SLP by means of the NMOS transistors 152 and 153 upon a sense line precharge signal SP in the high logic level being supplied to the gate electrodes of the NMOS transistors 151, 152 and 153.

Figure 2A:
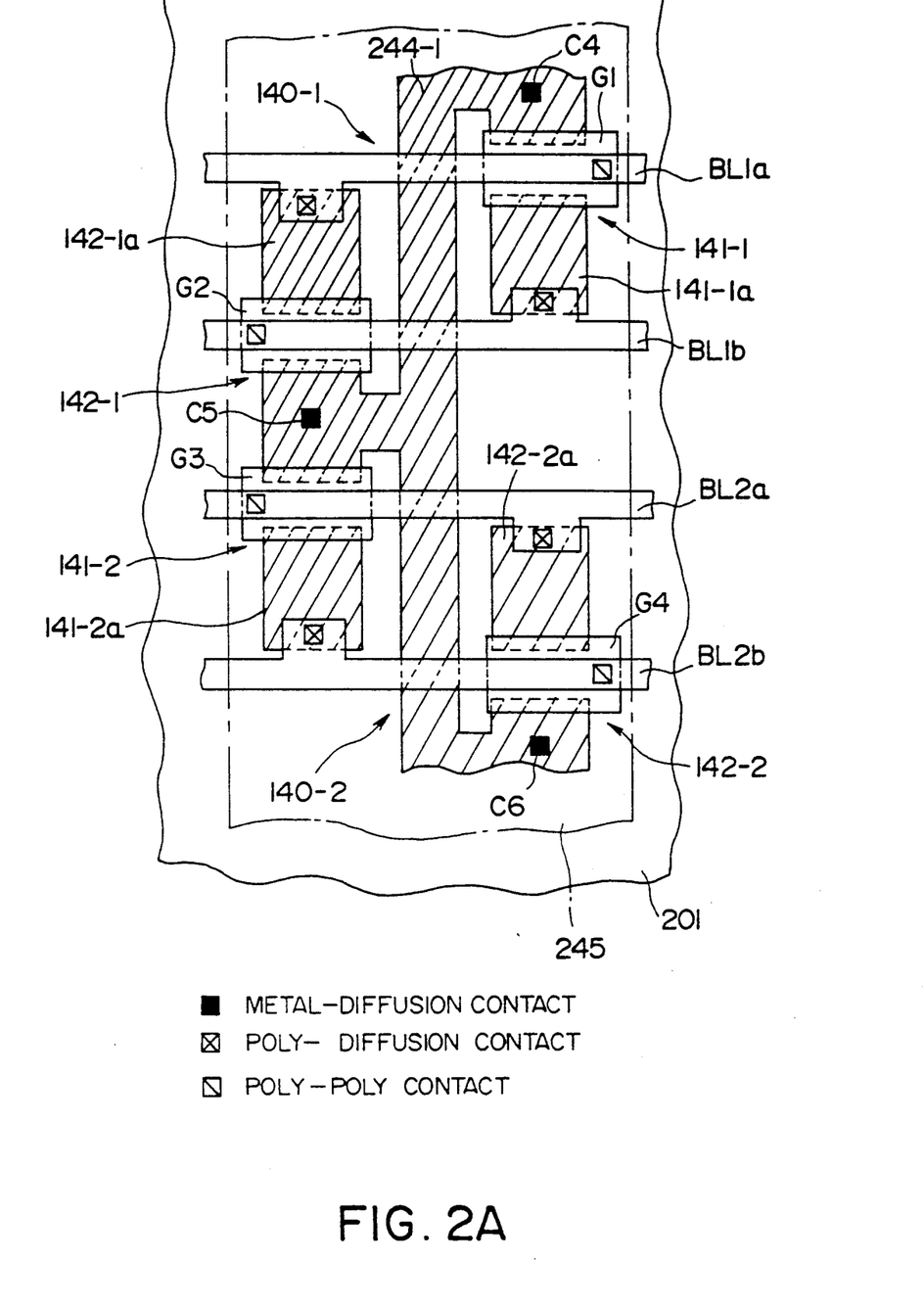
FIGS. 2A and 2B are partial pattern layouts with respect to the sense amplifiers and the associated circuits shown in FIG. 1.
Figure 2B:
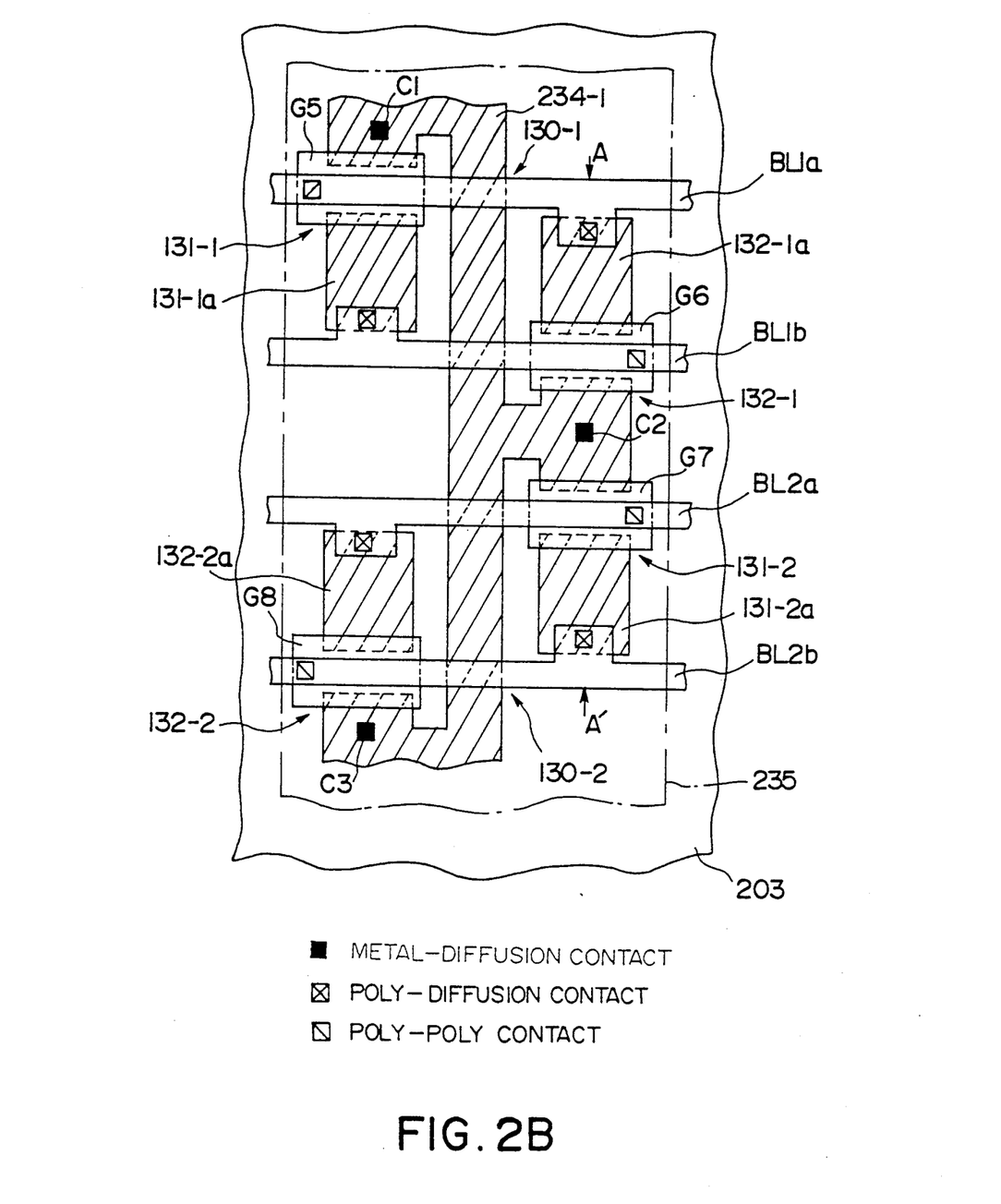

Now, the partial pattern layouts of the first and third sense amplifiers 140-1 and 140-2 in FIG. 1 and the positive channel type sense amplifiers 130-1 and 130-2 in FIG. 1 according to the present invention are respectively and clearly shown in FIGS. 2A and 2B.

The first and third sense amplifiers 140-1 and 140-2 are formed in and over a first region 201 in a major surface of a semiconductor substrate (not shown). The bit lines BL1a, BL1b, BL2a and BL2b, each made of conductive poly-crystalline silicon, in FIG. 2A, formed over the first region 201, respectively extend parallel to one another and toward a first direction. The bit line BL1a is connected to the gate electrode G1 of the NMOS transistor 141-1 through a poly-poly contact; the bit line BL1b is connected to the gate electrode G2 of the NMOS transistor 142-1 through a poly-poly contact; the bit line BL2a is connected to the gate electrode G3 of the NMOS transistor 141-2 through a poly-poly contact; and the bit line BL2b is connected to the gate electrode G4 of the NMOS transistor 142-2 through a poly-poly contact. The NMOS transistor 141-1 has the first electrode formed by a negative type diffusion region 141-1a which is connected to the bit line BL1b through a poly-diffusion contact. The NMOS transistor 142-1 has the first electrode formed by a negative type diffusion region 142-1a which is connected to the bit line BL1a through a poly-diffusion contact. The NMOS transistor 141-2 has the first electrode formed by a negative type diffusion region 141-2a which is connected to the bit line BL2b through a poly-diffusion contact. The NMOS transistor 142-2 has the first electrode formed by a negative type diffusion region 142-2a which is connected to the bit line BL2a through a poly-diffusion contact. The second electrodes of the NMOS transistors 141-1, 142-1, 141-2 and 142-2 are commonly formed by a first common (negative type) diffusion region 244-1 substantially corresponding to the first common diffusion line D2 in FIG. 1.

The first common diffusion region 244-1, formed in the first region 201 of the semiconductor substrate, has a first main portion extending in a second direction perpendicular to the bit lines BL1a, BL1b, BL2a and BL2b so as to intersect regions of the first region 201 beneath the respective bit lines BL1a, BL1b, BL2a and BL2b. The first common diffusion region 244-1 further has first, second, third and fourth sleeve portions respectively extend from the first main portion of the first common diffusion region 244-1 toward the corresponding gate electrodes G1, G2, G3 and G4. The first, second, third and fourth sleeve portion respectively correspond to the second electrodes of the NMOS transistors 141-1, 142-1, 141-2 and 142-2 and respectively cooperate with the corresponding negative type diffusion region 141-1a, 142-1a, 141-2a and 142-2a to define channel regions therebetween where is beneath the corresponding gate electrodes G1, G2, G3 and G4. The second and third sleeve portions constitute a first common sleeve portion as shown in FIG. 2A.

A metal conductive layer 245, which is made of aluminium, shown by an alternate long and short dash line in FIG. 2A and correspond to the first sense line SLN, extends over and perpendicular to the bit lines BL1a, BL1b, BL2a and BL2b so as to cover the first common diffusion region 244-1 thereunder. The metal conductive layer 245 is connected to the first common diffusion region 244-1 through metal-diffusion contacts C4, C5 and C6 respectively located in the first sleeve portion, first common sleeve portion and fourth sleeve portion of the first diffusion region 244-1. The metal conductive layer 245, as mentioned foregoing accompanied with FIG. 1, is connected to the drive circuit 145 in FIG. 1.

In FIG. 2A, there is disclosed only two pairs of the bit lines BL1a, BL1b, BL2a and BL2b and two sense amplifiers 140-1 and 140-2 consisting of the NMOS transistors. However, further pairs of bit lines (not shown), each coupled to another sense amplifier employing other NMOS transistors, extend parallel to the two pairs of the bit lines BL1a, BL1b, BL2a and BL2b. The first common diffusion region 244-1 also extends in the second direction perpendicular to other bit line pairs. Thus, similarly to the first common sleeve portion, the first and fourth sleeve portions of the diffusion region 244-1 respectively constitute common sleeve portions of adjacent sense amplifiers. Therefore, the layout of the sense amplifiers according to the present invention, shown in FIG. 2A, may substantially attain a single metal-diffusion contact per sense amplifier. Further, the unevenness in the contact resistance of the contact will not affect the operation of sense amplifiers because the metal-diffusion contacts C4, C5 and C6 are commonly connected to one another by means of the first common diffusion region 244-1. Still, even though the some of the metal-diffusion contacts has the flaw (disconnection), the sense amplifier can work since the sense amplifiers receive the Ground level voltage (Vss) at their sense nodes through the remaining metal-diffusion contacts.

Similarly to the above mentioned first and third sense amplifiers, the second and fourth sense amplifiers 130-1 and 130-2 are formed in and over a second region 203 (FIG. 2B) in a major surface of a semiconductor substrate (not shown). The bit lines BL1a, BL1b, BL2a and BL2b, each made of conductive poly-crystalline silicon, in FIG. 2B, formed over the second region 203, respectively extend parallel to one another and toward a first direction. The bit line BL1a is connected to the gate electrode G5 of the PMOS transistor 131-1 through a poly-poly contact; the bit line BL1b is connected to the gate electrode G6 of the PMOS transistor 132-1 through a poly-poly contact; the bit line BL2a is connected to the gate electrode G7 of the PMOS transistor 131-2 through a poly-poly contact; and the bit line BL2b is connected to the gate electrode G8 of the PMOS transistor 132-2 through a poly-poly contact. The PMOS transistor 131-1 has the first electrode formed by a positive type diffusion region 131-1a which is connected to the bit line BL1b through a poly-diffusion contact. The PMOS transistor 132-1 has the first electrode formed by a positive type diffusion region 132-1a which is connected to the bit line BL1a through a poly-diffusion contact. The PMOS transistor 131-2 has the first electrode formed by a positive type diffusion region 131-2a which is connected to the bit line BL2b through a poly-diffusion contact. The PMOS transistor 132-2 has the first electrode formed by a positive channel type diffusion region 132-2a which is connected to the bit line BL2a through a poly-diffusion contact. The second electrodes of the PMOS transistors 131-1, 132-1, 131-2 and 132-2 are commonly formed by a second common (positive type) diffusion region 234-1 substantially corresponding to the second common diffusion line D1 in FIG. 1.

The second common diffusion region 234-1, formed in the second region 203 of the semiconductor substrate, has a second main portion extending in a second direction perpendicular to the bit lines BL1a, BL1b, BL2a and BL2b so as to intersect regions of the second region 203 beneath the respective bit lines BL1a, BL1b, BL2a and BL2b. The second common diffusion region 234-1 further has fifth, sixth, seventh and eighth sleeve portions respectively extend from the second main portion of the second common diffusion region 234-1 toward the corresponding gate electrodes G5, G6, G7 and G8. The fifth, sixth, seventh and eighth sleeve portions respectively correspond to the second electrodes of the PMOS transistors 131-1, 132-1, 131-2 and 132-2 and respectively cooperate with the corresponding positive type diffusion region 131-1a, 132-1a, 131-2a and 132-2a to define channel regions therebetween where is beneath the corresponding gate electrodes G1, G2, G3 and G4. The sixth and seventh sleeve portions constitute a second common sleeve portion as shown in FIG. 2B.

A metal conductive layer 235, which is made of aluminium, shown by an alternate long and short dash line in FIG. 2B and correspond to the second sense line SLP, extends over and perpendicular to the bit lines BL1a, BL1b, BL2a and BL2b so as to cover the first common diffusion region 234-1 thereunder. The metal conductive layer 235 is connected to the second common diffusion region 234-1 through metal-diffusion contacts C1, C2 and C3 respectively located in the fifth sleeve portion, second common sleeve portion and eighth sleeve portion of the second diffusion region 234-1. The metal conductive layer 235, as mentioned foregoing accompanied with FIG. 1, is connected to the drive circuit 135 in FIG. 1.

In FIG. 2B, there is disclosed only two pairs of the bit lines BL1a, BL1b, BL2a and BL2b and two sense amplifiers 130-1 and 130-2. However, further pairs of bit lines (not shown), each coupled to another sense amplifier employing other PMOS transistors, extend parallel to the two pairs of the bit lines BL1a, BL1b, BL2a and BL2b. The second common diffusion region 234-1 also extend in the second direction perpendicular to other bit line pairs. Thus, similarly to the second common sleeve portion, the fifth and eighth sleeve portions of the diffusion region 234-1 respectively constitute common sleeve portions of adjacent sense amplifiers. Therefore, the layout of the sense amplifiers according to the present invention, shown in FIG. 2B, may substantially attain a single metal-diffusion contact per sense amplifier. Actually with respect to the dimension of the above mentioned sense amplifiers 130-1 and 130-2 employed in the actual 64 mega-bit DRAM under development, the pitch of the bit lines, each having 0.5 microns in width, is required to be around 2 microns. The gate electrodes G5–G8 is physically around 0.6 microns in width and 1.55–1.60 microns in length. While the metal contacts C1, C2 and C3 each is required to be around 0.6 micron in both of length and width. It is noted that the pattern layout in FIG. 2B and others can not be precisely traced in dimension thereof due to the drafting technique problem.

Further, the unevenness in the contact resistance of the contact will not affect the operation of sense amplifiers because the metal-diffusion contacts C1, C2 and C3 are commonly connected to one another by means of the second common diffusion region 234-1. Still, even though the some of the metal-diffusion contacts has the flaw (disconnection), the sense amplifier can work since the sense amplifiers receive the supply voltage (Vcc) at their sense nodes through the remaining metal-diffusion contacts.

Figure 2C:
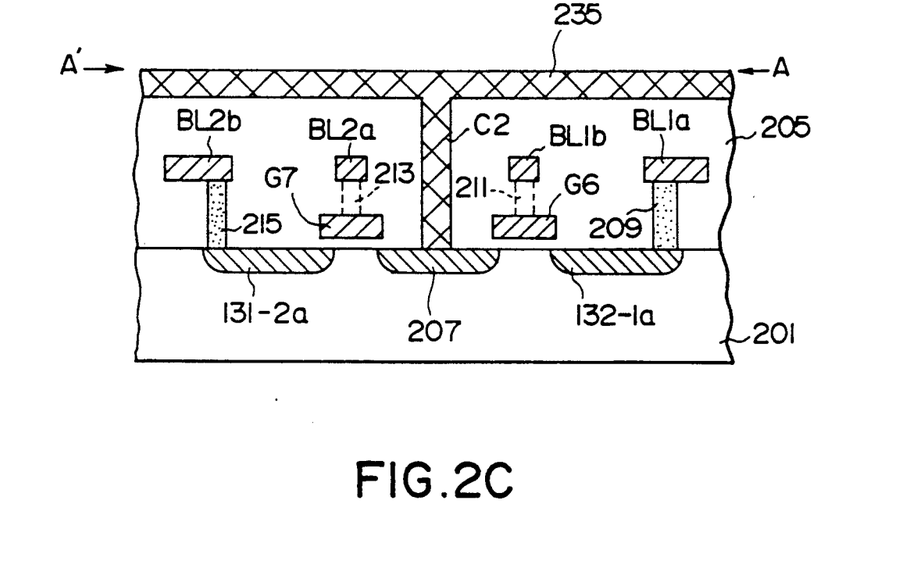
FIG. 2C is a partial cross-section taken along the line A-A' in FIG. 2B.

A partial cross-section taken along the line A—A' in FIG. 2B is shown in FIG. 2C. The positive type diffusion regions 132-1a and 131-2a and the second common sleeve portion 207 of the second common (positive type) diffusion region 234-1 are formed in a semiconductor substrate 201. The positive type diffusion region 132-1a and the second common sleeve portion 207 define a channel region therebetween in the major surface of the substrate 201. The gate electrode G6 is formed over the channel region through a gate insulating film. While the positive type diffusion region 131-2a and the second common sleeve portion 207 define another channel region therebetween in the major surface of the substrate 201. The gate electrode G7 is formed over the channel region through a gate insulating film of an intermediate insulating layer 205 which is a composite layer of multi-insulating films. Both of the gate electrodes G6 and G7 are extended in a first level of the intermediate insulating layer 205. The bit line BL1a is connected to the positive type diffusion region 132-1a through the poly-diffusion contact 209. The bit line BL1b is connected to the gate electrode G6 through the poly-poly contact 211 shown by a doted line. The bit line BL2a is connected to the gate electrode G7 through the poly-poly contact 213. The bit line BL2b is connected to the positive type diffusion region 131-2a through the poly-diffusion contact 215. These bit lines BL1a–BL2b all are extended in a second level of the intermediate insulating layer 205. The metal conductive layer 235, extending over the intermediate insulating layer 205, is connected to the second common sleeve portion 207 through the metal-diffusion contact C2.

Figure 3:
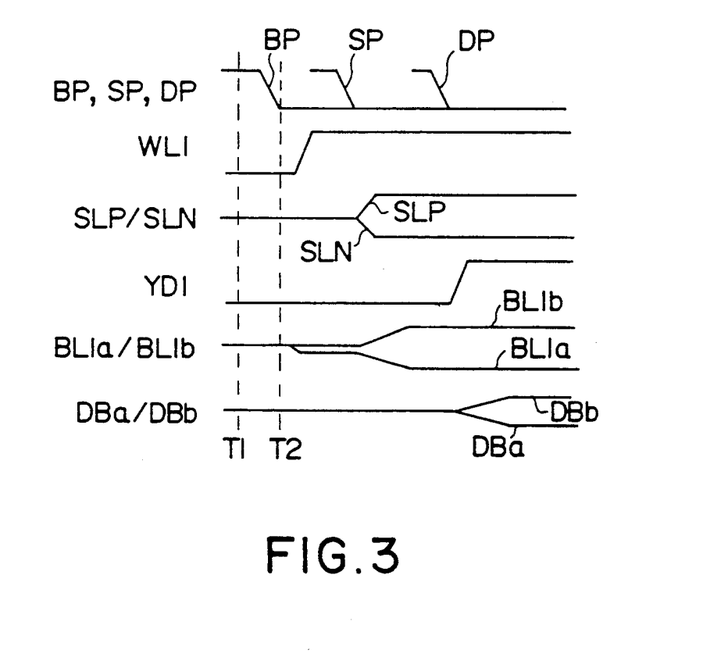
FIG. 3 is a timing chart to explain the sense operation of the sense amplifier according to the first embodiment of the invention.

There will be briefly discussed about the read operation of the above mentioned sense amplifiers 140-1 and 130-1 hereinunder accompanied with FIG. 3 in case that the memory cell 111-1, which stores an information representing the low logic level or "0", has been accessed, provided that the metal-diffusion contact C1 in the sense amplifier 130-1 has infinite resistance (i.e. the contact C1 became disconnection status).

As shown in FIG. 3, in a time of T1, the bit line precharge signal BP, the sense line precharge signal SP and the data bus precharge signal DP are respectively in the high logic levels (or the supply voltage level Vcc). Accordingly the bit lines BL1a and BL1b are preliminary charged up to the half of the supply voltage level ($\frac{1}{2}$ Vcc) by the bit line precharge circuits 120-1, while the first and second sense lines SLN and SLP and the data bus lines DBa and DBb are also respectively and preliminary charged up to the half of the supply voltage level ($\frac{1}{2}$ Vcc) by means of the precharge circuits 150 and 170. In the meantime, the level of the word line WL1 is in the low logic level (or the Ground level).

After the bit line precharge signal BP is changed from the high logic level to the low logic level, the level of the word line WL1 is changed from low to high (Vcc level, preferably, Vcc level plus Vth i.e. a boosted high voltage level) at a time of T2 in order to select the memory cell 111-1 storing the information "0". The minute potential difference appears in between the bit lines BL1a and BL1b.

Next when the sense line precharge signal SP is changed to the low logic level and succeedingly the sense amplifier control signal SCN in the high logic level and the sense amplifier control signal SCP in the low logic level are respectively applied to the respective driver circuit 145 and 135 in FIG. 1, the first sense line SLN goes in the low logic level and the second sense line SLP goes in the high logic level.

In this situation, the metal-diffusion contact C1 cannot supply the high logic level voltage from the second sense line SLP to the node S2 of the sense amplifier 130-1 since the metal diffusion contact C1 has infinite resistance. However the node S2 of the sense amplifier 130-1 can receive the high logic level voltage from the second sense line SLP through the metal-diffusion contacts C2 and C3 and the second common diffusion line D1 (the second common diffusion region). Therefore the sense amplifier 130-1 can perform the normal sense operation thereof such that the sense amplifier 130-1, cooperating with the sense amplifier 140-1, amplifies the potential difference in between the bit lines BL1a and BL1b. Then the level of the bit line BL1b goes to the high logic level while that of the bit line BL1a goes to the low logic level.

After that, the data bus precharge signal DP goes in the low logic level and succeedingly the selection signal YD1 goes in the high logic level, then the data bus line DBb goes toward the high logic level while the data bus line DBa goes toward the low logic level.

In the above mentioned operation, those signals BP, SP, DP, SCN, SCP and YD1 may be generated in known sequence by a conventional control circuit known to the person in the art.

Second Embodiment

Figure 4:
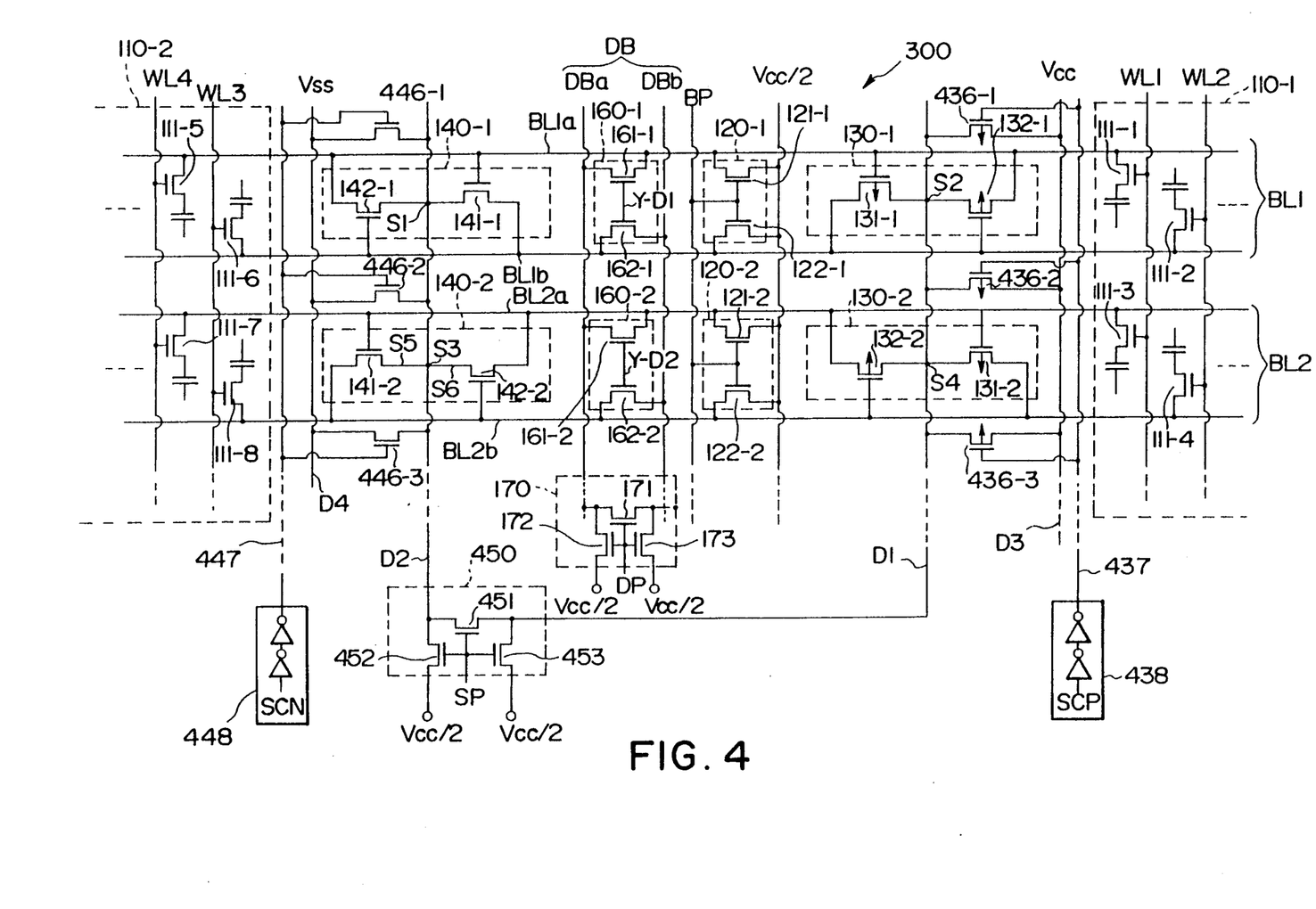
FIG. 4 is a partial circuit diagram of the second embodiment of the semiconductor device according to the invention.
Figure 5:
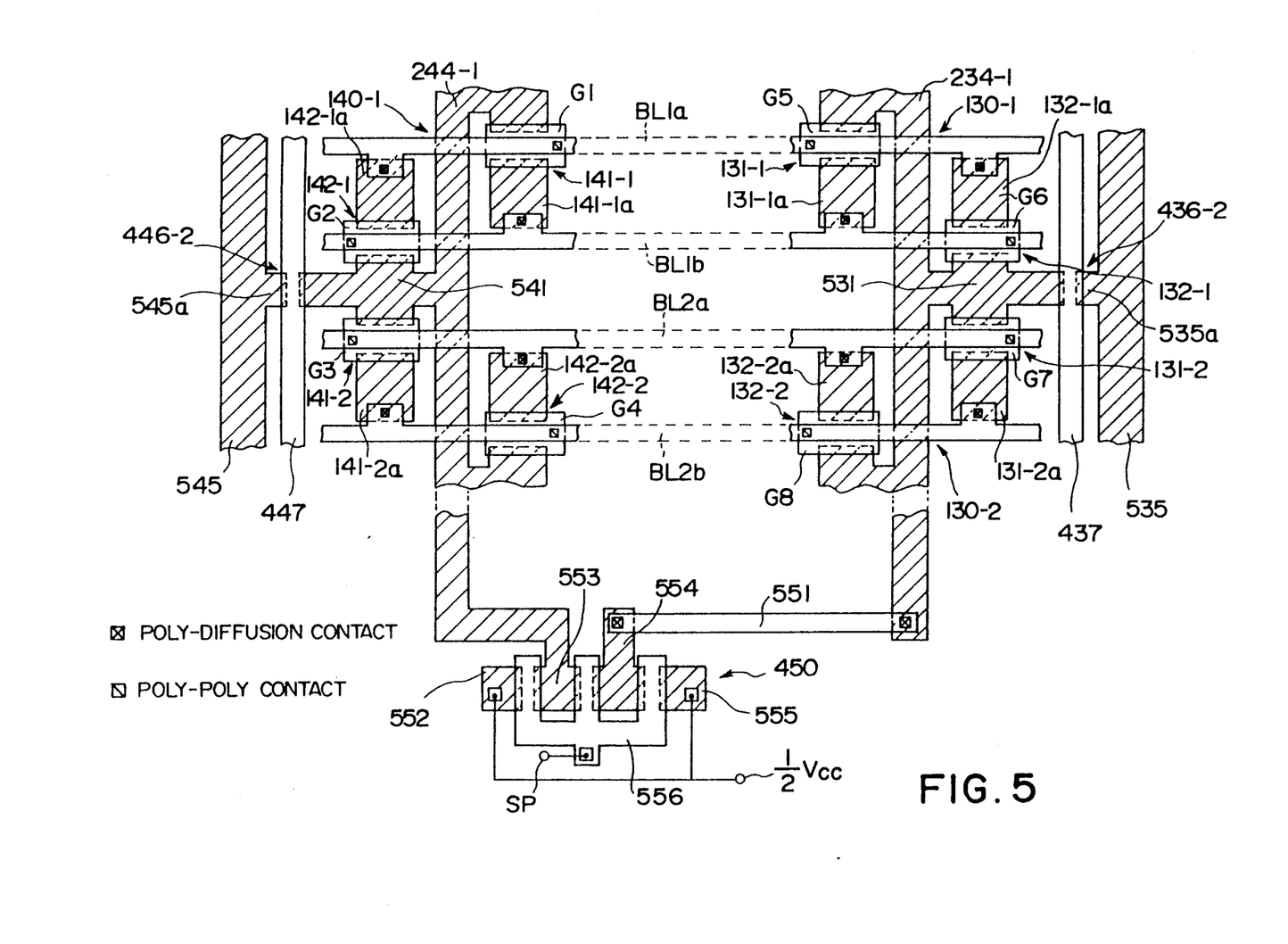
FIG. 5 is a partial pattern layout with respect to the sense amplifiers and the associated circuits shown in FIG. 4.

A second embodiment according to the present invention is shown in FIGS. 4 and 5 where circuits, patterns and transistors that are substantially identical with those shown in FIGS. 1, 2A and 2B are assigned the same reference numerals as in those other figures.

A semiconductor memory device 300 incorporating the present invention is shown in FIG. 4. The semiconductor memory device 300 employs a conventional first memory cell array 110-1 including memory cells 111-1, 111-2, 111-3 and 111-4 therein each having a NMOS transistor and a capacitor to store data therein; a conventional second memory cell array 110-2 including memory cells 111-5, 111-6, 111-7 and 111-8 therein each having a NMOS transistor and a capacitor to store data therein; a conventional first bit line pair BL1, comprised of bit lines BL1a and BL1b, coupled to the memory cells 111-1, 111-2, 111-5 and 111-6; and a second bit line pair BL2, comprised of bit lines BL2a and BL2b, coupled to the memory cells 111-3, 111-4, 111-7 and 111-8. The memory cells 111-1–111-8 are respectively coupled to one of word lines WL1, WL2, WL3 and WL4 such that one of the word lines WL1–WL4 is connected to the gate electrode of the NMOS transistor in the corresponding memory cell.

The bit line pairs BL1 and BL2 are respectively coupled to conventional bit line precharge circuits 120-1 and 120-2. The precharge circuit 120-1 provides a one-half supply voltage (Vcc/2, wherein Vcc is around 3.3 volts in 64 mega-bit DRAM) to both the bit lines BL1a and BL1b of the first bit line pair BL1 through respective NMOS transistors 121-1 and 122-1 upon bit line precharge signal BP being in a high logic level. The precharge circuit 120-2 also provides a half of supply voltage (Vcc/2) to both the bit lines BL2a and BL2b of the second bit line pair BL2 through respective NMOS transistors 121-2 and 122-2 upon bit line precharge signal BP being in high logic level.

The bit line pairs BL1 and BL2 are further coupled to a data bus pair DB comprised of data bus lines DBa and DBb through conventional transfer circuits 160-1 and 160-2. The transfer circuit 160-1 has NMOS transistors 161-1 and 162-1, of which gate electrodes commonly receive a selection signal Y-D1 generated from a conventional decoder circuit (not shown) which provides respective transfer circuits 160-1 and 160-2 with selection signals Y-D1 and Y-D2. The NMOS transistor 161-1 and 162-1 connects the bit lines BL1a and BL1b with the data bus lines DBa and DBb upon the selection signal Y-D1 being in high logic level. The transfer circuit 160-2 has NMOS transistors 161-2 and 162-2, of which gate electrodes commonly receive the selection signal Y-D2. The NMOS transistor 161-2 and 162-2 connects the bit lines BL2a and BL2b with the data bus lines DBa and DBb upon the selection signal Y-D2 being in a high logic level. The conventional decoder circuit (not shown) sets one of the selection signals Y-D1 and Y-D2 in the high logic level and the remain in the low logic level so as to select one of the bit line pairs BL1 and BL2 to be connected to the data bus pair DBa and DBb.

The data bus pair DB is further connected to a conventional data bus precharge circuit 170, including three NMOS transistors 171, 172 and 173, which equalizes the data bus lines DBa and DBb in potential by means of the NMOS transistor 171 and simultaneously provides a one-half supply voltage (Vcc/2) to both of the data bus lines DBa and DBb by means of the NMOS transistors 172 and 173 upon a data bus precharge signal DP in the high logic level being supplied to the gate electrodes of the NMOS transistors 171, 172 and 173.

The first bit line-pair BL1 is further coupled to a first sense amplifier 140-1 and a second sense amplifier 130-1. The first sense amplifier 140-1 includes NMOS transistors 141-1 and 142-1 each having first and second electrodes and a gate electrode. The first electrode of the NMOS transistor 142-1 is connected to the bit line BL1a; the gate electrode of the NMOS transistor 142-1 is connected to the bit line BL1b; the second electrode of the NMOS transistor 142-1 is connected to the second electrode of the NMOS transistor 141-1 through a node S1; the gate electrode of the NMOS transistor 141-1 is connected to the bit line BL1a; and the first electrode of the NMOS transistor 141-1 is connected to the bit line BL1b. The second sense amplifier 130-1 includes PMOS transistors 131-1 and 132-1 each having first and second electrodes and a gate electrode. The first electrode of the PMOS transistor 132-1 is connected to the bit line BL1a; the gate electrode of the PMOS transistor 132-1 is connected to the bit line BL1b; the second electrode of the PMOS transistor 132-1 is connected to the second electrode of the PMOS transistor 131-1 through a node S2; the gate electrode of the PMOS transistor 131-1 is connected to the bit line BL1a; the first electrode of the PMOS transistor 131-1 is connected to the bit line BL1b.

Like the first bit line pair BL1, the second bit line pair BL2 is coupled to a third sense amplifier 140-2 and a fourth sense amplifier 130-2. The third sense amplifier 140-2 includes NMOS transistors 141-2 and 142-2 each having first and second electrodes and a gate electrode. The first electrode of the NMOS transistor 142-2 is connected to the bit line BL2a; the gate electrode of the NMOS transistor 142-2 is connected to the bit line BL2b; the second electrode of the NMOS transistor 142-2 is connected to the second electrode of the NMOS transistor 141-2 through a node S3; the gate electrode of the NMOS transistor 141-2 is connected to the bit line BL2a; and the first electrode of the NMOS transistor 141-2 is connected to the bit line BL2b. The fourth sense amplifier 130-2 includes PMOS transistors 131-2 and 132-2 each having first and second electrodes and a gate electrode. The first electrode of the PMOS transistor 132-2 is connected to the bit line BL2a; the gate electrode of the PMOS transistor 132-2 is connected to the bit line BL2b; the second electrode of the PMOS transistor 132-2 is connected to the second electrode of the PMOS transistor 131-2 through a node S4; the gate electrode of the PMOS transistor 131-2 is connected to the bit line BL2a; and the first electrode of the PMOS transistor 131-2 is connected to the bit line BL1b.

The nodes S1 and S3 of the first and third sense amplifiers 140-1 and 140-2 are commonly connected to a first common diffusion line D2 which is connected to a common diffusion line precharge circuit 450. The nodes S2 and S4 of the second and fourth sense amplifiers 130-1 and 130-2 are commonly connected to a second common diffusion line D1 which is also connected to the common diffusion line precharge circuit 450 including three NMOS transistors 451, 452 and 453, which equalizes the first and second common diffusion lines D2 and D1 in potential by means of the NMOS transistor 451 and simultaneously provides a one-half supply voltage (Vcc/2) to both of the first and second common diffusion lines D2 and D1 by means of the NMOS transistors 452 and 453 upon a precharge signal SP in the high logic level being supplied to the gate electrodes of the NMOS transistors 451, 452 and 453.

The first common diffusion line D2 is further coupled to a ground diffusion line D4, supplying the ground level voltage (Vss), through NMOS transistors 446-1, 446-2 and 446-3. Since the gate electrodes of the NMOS transistors 446-1, 446-2 and 446-3 are commonly connected to a first sense control line 447 which is driven by a driver 448 responsive to the sense amplifier control signal SCN, the NMOS transistors 446-1, 446-2 and 446-3 simultaneously connect the first common diffusion line D2 with the ground diffusion line D4 at the time of the first sense control line 447 being in the high logic level (i.e. the sense amplifier control signal SCN being in the high logic level). The second common diffusion line D1 is further coupled to a supply diffusion line D4, supplying the supply level voltage (Vcc), through PMOS transistors 436-1, 436-2 and 436-3. Since the gate electrodes of the PMOS transistors 436-1, 436-2 and 436-3 are commonly connected to a second sense control line 437 which is driven by a driver 438 responsive to the sense amplifier control signal SCP, the PMOS transistors 436-1, 436-2 and 436-3 simultaneously connect the second common diffusion line D1 with the supply diffusion line D4 at the time of the second sense control line 437 being in the low logic level (i.e. the sense amplifier control signal SCP being in the low logic level).

Therefore, according to the second embodiment of the present invention, the areas, respectively forming the drivers 448 and 438 therein, can be reduced since it is not necessary for each of the drivers 448 and 438 to supply the first and second common diffusion lines D2 and D1 with the Ground level voltage or supply level voltage and it is only necessary to drive the first and second sense control lines 447 and 437 which have vary small capacitance therein in comparison with the first and second diffusion lines D2 and D1.

Now, in order to explain another advantage according to the second embodiments of the present invention, the partial pattern layouts of the first and third sense amplifiers 140-1 and 140-2, the positive channel type sense amplifiers 130-1 and 130-2 and the associated circuits in FIG. 4 are shown in FIG. 5.

At the left side of FIG. 5, the first and third sense amplifiers 140-1 and 140-2 are formed in and over the major surface of a semiconductor substrate (not shown). The bit lines BL1a, BL1b, BL2a and BL2b, each made of conductive poly-crystalline silicon, respectively extend parallel to one another and toward a first direction. The bit line BL1a is connected to the gate electrode G1 of the NMOS transistor 141-1 through a poly-poly contact; the bit line BL1b is connected to the gate electrode G2 of the NMOS transistor 142-1 through a poly-poly contact; the bit line BL2a is connected to the gate electrode G3 of the NMOS transistor 141-2 through a poly-ploy contact; and the bit line BL2b is connected to the gate electrode G4 of the NMOS transistor 142-2 through a poly-poly contact. The NMOS transistor 141-1 has the first electrode formed by a negative type diffusion region 141-1a which is connected to the bit line BL1b through a poly-diffusion contact. The NMOS transistor 142-1 has the first electrode formed by a negative type diffusion region 142-1a which is connected to the bit line BL1a through a poly-diffusion contact. The NMOS transistor 141-2 has the first electrode formed by a negative type diffusion region 141-2a which is connected to the bit line BL2b through a poly-diffusion contact. The NMOS transistor 142-2 has the first electrode formed by a negative type diffusion region 142-2a which is connected to the bit line BL2a through a poly-diffusion contact. The second electrodes of the NMOS transistors 141-1, 142-1, 141-2 and 142-2 are commonly formed by a first common (negative type) diffusion region 244-1 substantially corresponding to the first common diffusion line D2 in FIG. 4.

The first common diffusion region 244-1 has a first main portion extending in a second direction perpendicular to the bit lines BL1a, BL1b, BL2a and BL2b so as to intersect regions of the first region 201 beneath the respective bit lines BL1a, BL1b, BL2a and BL2b. The first common diffusion region 244-1 further has first, second, third and fourth sleeve portions respectively extend from the first main portion of the first common diffusion region 244-1 toward the corresponding gate electrodes G1, G2, G3 and G4. The first, second, third and fourth sleeve portions respectively correspond to the second electrodes of the NMOS transistors 141-1, 142-1, 141-2 and 142-2 and respectively cooperate with the corresponding negative type diffusion region 141-1a, 142-1a, 141-2a and 142-2a to define channel regions therebetween beneath the corresponding gate electrodes G1, G2, G3 and G4. The second and third sleeve portions constitute a first common sleeve portion 541 as shown in FIG. 5. The first common sleeve portion 541 extends toward the first sense control line 447, made of conductive poly-crystalline silicon, extending in the second direction. The ground negative type diffusion region 545 (corresponding to the ground diffusion line D4 in FIG. 4), extending in the second direction, has a first projection portion 545a extending toward the first sense control line 447. Thereby the first common sleeve portion 541 and the first projection portion define a channel region therebetween beneath the first sense control line and form a NMOS transistor therein associated with the first sense control line 447. Thus the ground negative type diffusion region 545 supplies the Ground level voltage to the entire first common diffusion region 244-1 through the first common sleeve portion 541 when the first sense control line 447 goes in the high logic level.

Like the above mentioned first and third sense amplifiers, in the right side of FIG. 5, the second and fourth sense amplifiers 130-1 and 130-2 are formed in and over a major surface of a semiconductor substrate (not shown). The bit line BL1a is connected to the gate electrode G5 of the PMOS transistor 131-1 through a poly-poly contact; the bit line BL1b is connected to the gate electrode G6 of the PMOS transistor 132-1 through a poly-poly contact; the bit line BL2a is connected to the gate electrode G7 of the PMOS transistor 131-2 through a poly-ploy contact; and the bit line BL2b is connected to the gate electrode G8 of the PMOS transistor 132-2 through a poly-poly contact. The PMOS transistor 131-1 has the first electrode formed by a positive type diffusion region 131-1a which is connected to the bit line BL1b through a poly-diffusion contact. The PMOS transistor 132-1 has the first electrode formed by a positive type diffusion region 132-1a which is connected to the bit line BL1a through a poly-diffusion contact. The PMOS transistor 131-2 has the first electrode formed by a positive type diffusion region 131-2a which is connected to the bit line BL2b through a poly-diffusion contact. The PMOS transistor 132-2 has the first electrode formed by a positive channel type diffusion region 132-2a which is connected to the bit line BL2a through a poly-diffusion contact. The second electrodes of the PMOS transistors 131-1, 132-1, 131-2 and 132-2 are commonly formed by a second common (positive type) diffusion region 234-1 substantially corresponding to the second common diffusion line D1 in FIG. 4.

The second common diffusion region 234-1, formed in the semiconductor substrate, has a second main portion extending in a second direction perpendicular to the bit lines BL1a, BL1b, BL2a and BL2b so as to intersect regions of the second region 203 beneath the respective bit lines BL1a, BL1b, BL2a and BL2b. The second common diffusion region 234-1 further has fifth, sixth, seventh and eighth sleeve portions that respectively extend from the second main portion of the second common diffusion region 234-1 toward the corresponding gate electrodes G5, G6, G7 and G8. The fifth, sixth, seventh and eighth sleeve portions respectively correspond to the second electrodes of the PMOS transistors 131-1, 132-1, 131-2 and 132-2 and respectively cooperate with the corresponding positive type diffusion region 131-1a, 132-1a, 131-2a and 132-2a to define channel regions therebetween beneath the corresponding gate electrodes G1, G2, G3 and G4. The sixth and seventh sleeve portions constitute a second common sleeve portion 531 as shown in FIG. 5. The second common sleeve portion 531 extends toward the second sense control line 437, made of conductive poly-crystalline silicon, extending in the second direction. The supply positive type diffusion region 535 (corresponding to the supply diffusion line D4 in FIG. 4), extending in the second direction, has a second projection portion 535a extending toward the second sense control line 437. Thereby the second common sleeve portion 531 and the second projection portion 535a define a channel region therebetween beneath the second sense control line 437 and form a PMOS transistor therein associated with the second sense control line 437. Thus the supply positive type diffusion region 535 supplies the supply level voltage to the entire second common diffusion region 234-1 through the second common sleeve portion 531 when the second sense control line 437 goes to the low logic level.

In FIG. 5, there is disclosed only two pairs of the bit lines BL1a, BL1b, BL2a and BL2b and four sense amplifiers 140-1, 140-2, 130-1 and 130-2. However, further pairs of bit lines (not shown), each coupled to another pair of sense amplifiers, extend parallel to the two pairs of the bit lines BL1a, BL1b, BL2a and BL2b. The first and second common diffusion regions 244-1 and 234-1 also extend in the second direction perpendicular to other bit line pairs. Thus, similarly to the second common sleeve portion, the fifth and eighth sleeve portions each of the diffusion regions 244-1 and 234-1 respectively constitute common sleeve portions of adjacent sense amplifiers. The common sleeve portions are, further, respectively coupled to either the ground negative or supply positive type diffusion regions 545 or 535 each through a MOS transistor.

The first common diffusion region 244-1 is connected to the common diffusion line precharge circuit 450 at one end. The second common diffusion region 234-1 is also connected to the common diffusion line precharge circuit 450 through a conductive poly-crystalline silicon line 551. The common diffusion line precharge circuit 450 has first, second, third and fourth (negative type) diffusion regions 552, 553, 554 and 555. The first and fourth diffusion regions 552 and 555 are commonly provided with the half of the supply voltage (½ Vcc). The first and second diffusion regions 552 and 553 define a first channel region therebetween of the NMOS transistor 452 in FIG. 4; the second and third diffusion regions 553 and 554 define a second channel region therebetween of the NMOS transistor 451; the third and fourth diffusion region 554 and 555 define a third channel region therebetween of the NMOS transistor 453.

The second diffusion region 553 is a part of the first common diffusion region 244-1. The third diffusion region 554 is connected to the second common diffusion region 234-1 through the conductive poly-crystalline silicon line 551 extending in the first direction.

Since the layout of the sense amplifiers according to the second embodiment of the present invention can attain no metal-diffusion contact per sense amplifier, it is not necessary to fear for the unevenness in the contact resistance of the metal-diffusion contacts.

While the invention has been particularly shown and described with reference to the preferred embodiments thereof, it will be understood by those skilled in the art that various changes in form and details may be made therein without departing from the spirit and scope of the invention.

For example, if possible in view of the space limitation on the layout of the device as shown in FIGS. 2A, 2B and 5, the aluminum metal lines each extending over respective diffusion regions in the substrate, can be connected to the diffusion region through more than one metal-diffusion contact in order to speed up the transmission of signals through the diffusion region.

Further, one can eliminate either the drivers 448 or 438 in FIG. 4 if the first sense control line 447 is connected to the second sense control line 437 through an invertor circuit.

What is claimed is:

1. A semiconductor memory device having a semiconductor substrate having a major surface thereof, comprising:
   a first pair of bit lines, formed over the major surface, having first and second bit lines, said first pair of bit lines being coupled to a first memory cell, said first memory cell causing a first potential difference between said first and second bit lines;
   a second pair of bit lines, formed over the major surface, having third and fourth bit lines, said second pair of bit lines being coupled to a second memory cell, said second memory cell causing a second potential difference between said third and fourth bit lines;
   a first sense amplifier having first and second transistors each having first, second and gate electrodes, said first and second transistors each being of a first conductivity type, the gate electrode of said first transistor being connected to said first bit line, the first electrode of the first transistor being connected to the second bit line, the gate electrode of the second transistor being connected to said second bit line, the first electrode of the second transistor being connected to the first bit line;
   a second sense amplifier having third and fourth transistors each having first, second and gate electrodes, said third and fourth transistors each being of the first conductivity type, the gate electrode of said third transistor being connected to the third bit line, the first electrode of said third transistor being connected to the fourth bit line, the gate electrode of said fourth transistor being connected to the fourth bit line, the first electrode of said fourth transistor being connected to the third bit line; and
   the second electrodes of said first, second, third and fourth transistors constituting a first common diffusion region formed in a first area of the major surface.

2. The device according to claim 1, further, comprising:
   a third sense amplifier having fifth and sixth transistors each having first, second and gate electrodes, said fifth and sixth transistors each being of a second conductivity type, the gate electrode of said fifth transistor being connected to said first bit line, the first electrode of said fifth transistor being connected to said second bit line, the gate electrode of said sixth transistor being connected to said second bit line, the first electrode of said sixth transistor being connected to said first bit line;
   a fourth sense amplifier having seventh and eighth transistors each having first, second and gate electrodes, said seventh and eighth transistors each being of the second conductivity type, the gate electrode of said seventh transistor being connected to said third bit line, the first electrode of said seventh transistor being connected to said fourth bit line, the gate electrode of said eighth transistor being connected to said fourth bit line, the first electrode of said eighth transistor being connected to said third bit line; and
   the second electrodes of said fifth, sixth, seventh and eighth transistors constituting a second common diffusion region formed in a second area of the major surface.

3. The device according to claim 2, wherein said first common diffusion region has a first main portion extending toward a first direction intersecting said first and second pairs of bit lines and first, second, third and fourth sleeve portions respectively extending from the first main portion toward the corresponding gate electrodes of said first, second, third and fourth transistors; and wherein said second common diffusion region has a second main portion extending toward the first direction and fifth, sixth, seventh and eighth sleeve portions respectively extending from the second main portion toward the corresponding gate electrodes of said first, second, third and fourth transistors.

4. The device according to claim 3, wherein said second and third sleeve portions constitute a first common sleeve portion; and wherein said sixth and seventh sleeve portions constitute a second common sleeve portion.

5. The device according to claim 4, further comprising:
   a first metal conductive line, formed over the first area, connected to said first common diffusion region through a plurality of first metal contacts;
   a second metal conductive line, formed over the second area, connected to said second common diffusion region through a plurality of second metal contacts.

6. The device according to claim 5, further comprising:
   a first supply voltage node providing said first metal conductive line with a first supply voltage through a first transistor; and
   a second supply voltage node providing said second metal conductive line with a second supply voltage through a second transistor.

7. The device according to claim 1, wherein said first common diffusion region is coupled to a first voltage supply diffusion region through a ninth transistor.

8. The device according to claim 2, wherein said first common diffusion region is coupled to a first voltage supply diffusion region through a ninth transistor: and wherein said second common diffusion region is coupled to a second voltage supply diffusion region through a tenth transistor.

9. The device according to claim 4, wherein said first common sleeve portion is coupled to a first voltage supply diffusion region through a ninth transistor; and wherein said second common sleeve portion is coupled to a second voltage supply diffusion region through a tenth transistor.

10. The device according to claim 9, wherein said first and second common diffusion region are commonly precharged by a common diffusion region precharge circuit.

* * * * *